United States Patent
Watanabe

(10) Patent No.: US 7,123,514 B2
(45) Date of Patent: Oct. 17, 2006

(54) MEMORY DEVICE FOR IMPROVED REFERENCE CURRENT CONFIGURATION

(75) Inventor: Yasuaki Watanabe, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 15 days.

(21) Appl. No.: 11/094,104

(22) Filed: Mar. 31, 2005

(65) Prior Publication Data
US 2005/0219905 A1 Oct. 6, 2005

(30) Foreign Application Priority Data
Mar. 31, 2004 (JP) .............................. 2004-103824

(51) Int. Cl.
*G11C 11/34* (2006.01)
*G11C 7/02* (2006.01)
(52) U.S. Cl. .................................. 365/185.21; 365/207
(58) Field of Classification Search ........... 365/185.21, 365/207
See application file for complete search history.

(56) References Cited

U.S. PATENT DOCUMENTS

2002/0153917 A1* 10/2002 Tanaka et al. ............... 324/765
2003/0076139 A1* 4/2003 Miyagawa et al. ......... 327/156
2005/0094472 A1* 5/2005 Ishikawa et al. ............ 365/226

FOREIGN PATENT DOCUMENTS

JP  2000-132986  5/2000

* cited by examiner

*Primary Examiner*—Amir Zarabian
*Assistant Examiner*—Anthan Tran
(74) *Attorney, Agent, or Firm*—Young & Thompson

(57) ABSTRACT

A memory device is composed of a memory array including floating gate memory cells; a sense amplifier designed to identify data stored in the memory array; and a reference current setting unit responsive to a trimming code for providing a reference current for the sense amplifier. The trimming code is defined as being all-0 for a reference current level to identify data stored in the memory array as logic "1", and is defined as being all-1 for a reference current level to identify data stored in the memory array as logic "0".

7 Claims, 5 Drawing Sheets

Fig. 4

| REFERENCE CURRENT | SMALL ← | | | | → LARGE | | |
|---|---|---|---|---|---|---|---|
| TRIMMING CODE MAPPING ACCORDING TO THE PRESENT INVENTION | 000 | 001 | 010 | 011 | 100 | 101 | 110 | 111 |
| CONVENTIONAL TRIMMING CODE MAPPING | 101 | 110 | 111 | 000 | 001 | 010 | 011 | 100 |

↑ (DEFAULT)

MEMORY DEVICE FOR IMPROVED REFERENCE CURRENT CONFIGURATION

BACKGROUND OF THE INVENTION

1. Field of the Invention

The present invention relates to memory devices, more particularly, to memory devices designed to provide improved reference current configuration for memory devices.

2. Description of the Related Art

Memory devices incorporating floating gate memory cells, such as flash memories, typically identify data stored in the memory cells using sense amplifiers which compare signal currents received from memory cells with reference currents. In a typical operation, a sense amplifier identifies the data stored in a target cell as logic "1", when the signal current received from the target cell is larger than the reference current. When the signal current received from the target memory cell is smaller than the reference current, on the other hand, the sense amplifier identifies the data stored in the target cell as logic "0".

Appropriately adjusting the current level of the reference current is important for reducing the data read error during read operation; if the reference current level is not appropriately configured, it may cause considerable data read errors. Japanese Laid-Open Patent Application No. P2000-132986 discloses a nonvolatile memory device based on floating gate memory cells, which are designed to achieve appropriate reference current level control. The disclosed memory device includes reference memory cells for reference current level adjustment in addition to memory cells for actually storing data. The disclosed memory device performs a trial using the reference memory cells, and adjusts the level of the reference currents on the basis of the trial.

One known approach for achieving appropriate reference current level control is to adjust the reference current level in response to a "trimming code" externally provided to indicate the desired reference current level. Such-designed memory devices include a reference current setting unit configurable with a trimming code, designed to develop the reference currents of a desired level in response to the trimming code. For a memory device incorporated within a computer system, for example, the reference current setting unit is configured with a trimming code during the reset sequence of the computer system, which involves initialization of the computer system after power-on or reset.

One issue is that appropriate reference current levels are different among the individual memory devices, due to the inevitable fabrication variation and the power supply fluctuation. In order to deal with this issue, an appropriate reference current level is usually determined at the factory for each memory device through the pre-shipment test, and the corresponding trimming codes is configured to the memory device. The trimming code is typically stored in a specific memory area within the floating gate memory array. The stored trimming code is obtained from the floating gate memory array and configured into the reference current setting unit, when the memory device is initialized, typically during the reset sequence implemented in the computer system.

Obtaining the stored trimming code from the floating gate memory array, however, requires the reference current setting unit to be configured with an appropriately determined reference current level before the access is implemented to the memory area where the trimming code is stored; obtaining the stored trimming code from the floating gate memory array itself requires appropriate reference current level setting. One approach for obtaining the stored trimming code from the memory array is to externally provide a default trimming code for the reference current setting unit; the reference current setting unit uses the default trimming code for obtaining the stored trimming code from the memory array.

Specifically, as shown in a flowchart of FIG. 1, a default trimming code is obtained from an external ROM at Step S101. The default trimming code is configured to the reference current setting unit. The reference current setting unit then provides default reference currents for the sense amplifiers, the level of which are determined on the basis of the default trimming code at Step S102. The sense amplifiers identify the trimming code stored in the specific memory area of the floating gate memory array at Step S103, and the trimming code obtained from the floating gate memory array is configured into the reference current setting unit in place of the default trimming code. The reference current setting unit provides the reference currents for the sense amplifiers in response to the trimming code obtained from the memory array at Step S104. Subsequently, the sense amplifiers identify data based on the reference currents of the current level thus configured.

FIG. 2 depicts an exemplary association of the trimming code with the reference currents to be generated in a conventional memory device. In the example shown in FIG. 2, the trimming code is a three-bit code. The default trimming code is "000", and the reference currents are increased as the value of the trimming code is increased, and vice versa. It should be noted that the negative value of the trimming code is represented in the two's complement.

The levels of the reference currents are required to be in a certain range for achieving successful data read from the memory array. The allowable current level range is dependent on the operation mode of the computer. The allowable current level range is relatively large during the reset sequence of the computer, because the computer operates at a relatively low frequency, typically around 2 MHz; the allowed current level range for the reset sequence is denoted by the symbol "S1". During normal operations, on the other hand, the allowed current level range is relatively small, because the computer operates at a relatively high frequency of 66 MHz or more.

The inevitable variation, including the fabrication variation and the power supply voltage variation, causes variation in the association of the trimming code with the actual level of the reference currents among memory devices. In FIG. 2, the reference current characteristics curve of a memory device incorporated in an "A" computer is denoted by the symbol "IA". Correspondingly, the reference current characteristics curves of memory devices incorporated in "B" and "C" computer are denoted by the symbol "IB" and "IC", respectively. The memory device within the "A" computer exhibits a relatively reduced reference current level, while the memory device within the "C" computer exhibits a relatively increased reference current level.

One problem is that a wrong trimming code may be obtained from the memory array due to the variation in the association of the trimming code and the actual reference current level. The wrong trimming code may cause data read errors in the memory device.

For the "B" computer, for example, correct data are obtained from the memory array within the memory device using the trimming code successfully obtained from the memory array. In detail, the appropriate trimming code is successfully obtained from the memory array using the default trimming code of "000", and the data stored in the memory array are also successfully obtained using the trimming code successfully obtained from the memory array.

For the "A" and "C" computers, on the other hand, wrong trimming codes are obtained from the memory arrays, and this causes unsuccessful data read from the memory array.

In detail, the memory devices within the "A" and "C" computers are required to be configured with trimming codes of "011" and "101", respectively, for achieving successful data read during normal operations; adjusting the reference current level in response to the trimming codes of "011" and "101" allows the reference current levels of the memory devices within the "A" and "C" computers to be in the region "S2", respectively.

For the "A" computer, however, the appropriate trimming code is not successfully obtained from the memory array, because the reference current level configured in response to the default trimming code is lower than the allowable reference current, out of the region "S1". The memory device within the "A" computer improperly identifies the three data bits of the trimming code stored in the memory array as logic "1", that is, improperly identifies the trimming code as "111", and configures the reference current setting unit with a wrong trimming code of "111". This results in that the reference current setting unit provides the sense amplifiers with reference currents of an inappropriate current level "IA01", as denoted by an arrow "A11".

Correspondingly, for the "C" computer, the appropriate trimming code is not successfully obtained from the memory array, because the reference current level configured in response to the default trimming code is higher than the allowable reference current, out of the region "S1". The memory device within the "C" computer improperly identifies the three data bits of the trimming code stored in the memory array as logic "0", that is, identifies the trimming code as "000" (which is identical to the default trimming code), and configures the reference current setting unit with a wrong trimming code of "000". This results in that the reference current setting unit provides the sense amplifiers with reference currents of an inappropriate current level "IC1" (identical to the current level "IC01"), as denoted by an arrow "C11".

SUMMARY OF THE INVENTION

The inventor has discovered that the afore-mentioned problem is resolved through appropriately defining the association of the trimming code with the reference current level.

In an aspect of the present invention, a memory device is composed of a memory array including floating gate memory cells; a sense amplifier designed to identify data stored in the memory array; and a reference current setting unit responsive to a trimming code for providing a reference current for the sense amplifier. The trimming code is defined as being all-0 for a reference current level to identify data stored in the floating gate memory array as logic "1", and is defined as being all-1 for a reference current level to identify data stored in the floating gate memory array as logic "0".

For the case that the sense amplifier is designed to identify data stored in the memory array as logic "1" when a signal current from the memory array is larger than the reference current, and as logic "0" when the signal current is smaller than the reference current, the trimming code is defined as being all-0 for the minimum reference current level, and defined as being all-1 for the maximum reference current level.

BRIEF DESCRIPTION OF THE DRAWINGS

The above and other advantages and features of the present invention will be more apparent from the following description taken in conjunction with the accompanied drawings, in which:

FIG. 4 depicts mappings between a trimming code and a reference current level defined for the memory devices according to the present invention and the prior art.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Figure 3:
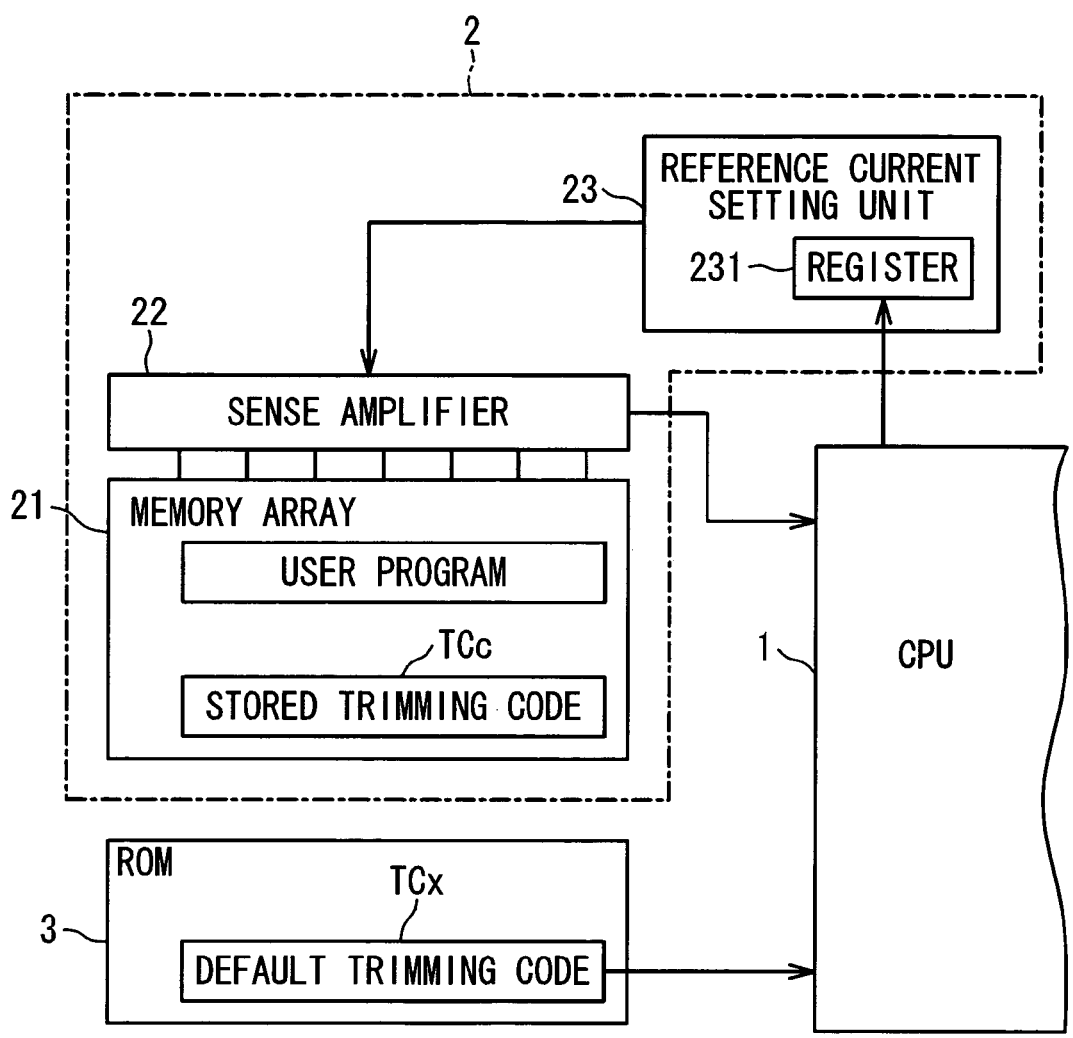
FIG. 3 is a schematic circuit diagram of a memory device according to the present invention.

FIG. 3 is a schematic block diagram of a computer system incorporating a flash memory in one embodiment of the present invention. The computer system includes a central processing unit (CPU) 1, a flash memory 2, and a ROM 3. The ROM 3 stores data and program modules necessary to boot the computer system during the reset sequence. The flash memory 2 includes a memory array 21 incorporating floating gate memory cells arranged in rows and columns, a sense amplifier circuit 22 incorporating a set of sense amplifiers that identify data stored in the memory array 21, and a reference current setting unit 23 which provides the sense amplifier circuit 22 with reference currents used for read operations. In order to configure the reference current setting unit 23 with an appropriate reference current level, a default trimming code TCx is stored in the ROM 3, and an appropriate trimming code TCc indicative of the reference current level appropriate for reading data is stored in the memory array 21 within the flash memory 2. The reference current setting unit 23 includes a register 231 used for storing a trimming code used for generating reference currents, which may be the default trimming code TCx from the ROM 3, or the trimming code TCc obtained from the memory array 21. The reference current setting unit 23 is designed to provide reference currents for the sense amplifier circuit 22 in response to the trimming code stored in the register 231.

FIG. 4 illustrates an exemplary mapping between the trimming code and the reference current level in the flash memory 2 in this embodiment; FIG. 4 also illustrates the mapping between the trimming code and the reference current level in the conventional memory device for comparison. As shown in FIG. 4, the default trimming code is defined as being "011" in this embodiment; the default trimming code configured into the ROM 3 is also defined as being "011", on the basis of the association shown in FIG. 4. Additionally, the trimming code corresponding to the reference current level to identify the data stored in the memory array as being logic "1" is defined as being an all-0 code, and that the trimming code corresponding to the reference current level to identify the data stored in the memory array as being logic "0" is defined as being an all-1 code. The trimming code increases as the increase in the reference current level to be configured, and vice versa. This implies that the default trimming code is selected as being closest to the mean value of the trimming code.

Figure 5:
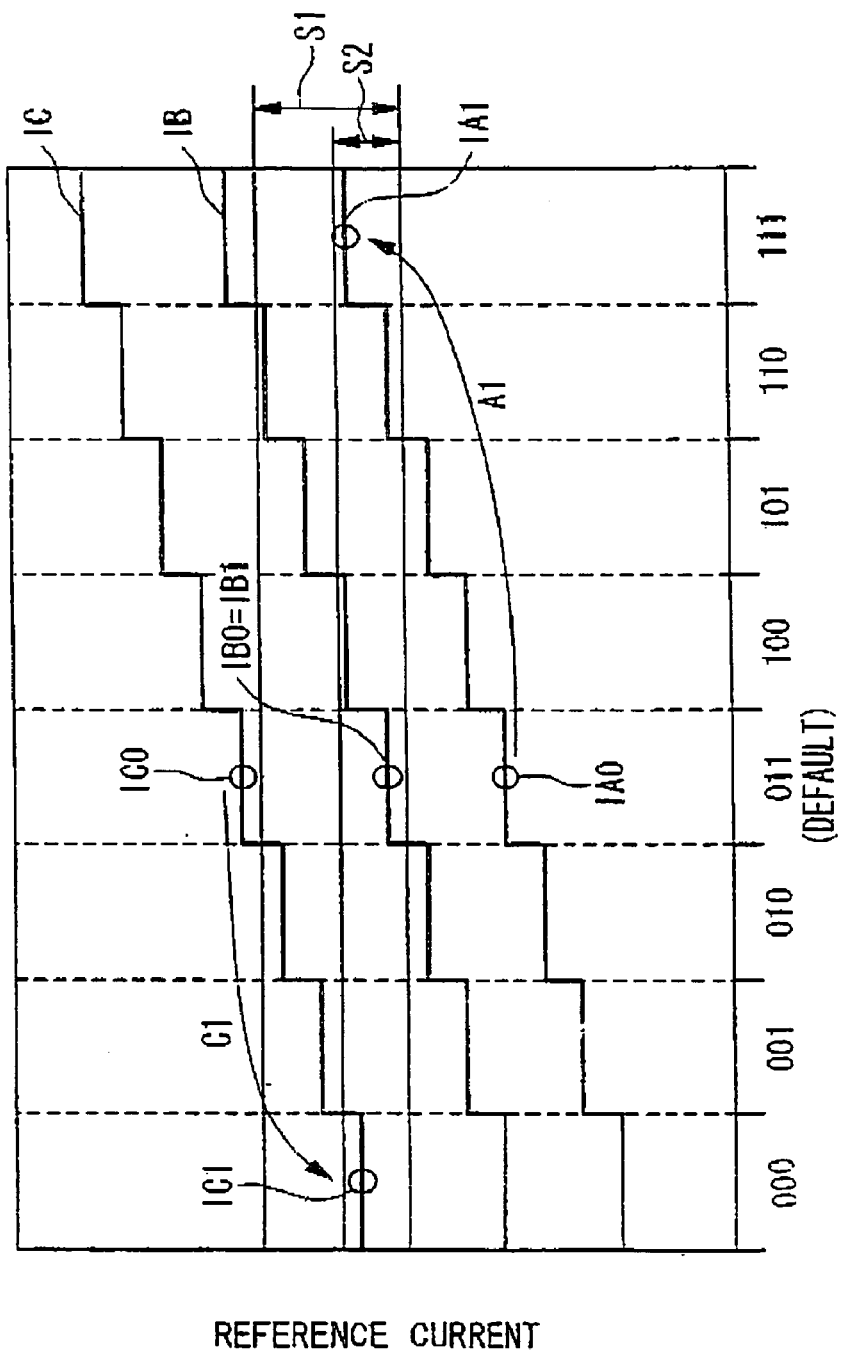
FIG. 5 depicts an exemplary association of a trimming code with a reference current level according the present invention.

FIG. 5 depicts an association of the trimming code with the reference current level in this embodiment. In detail, FIG. 5 depicts a set of exemplary reference current level characteristics of "A", "B", and "C" computers, denoted by the symbols "IA", "IB", and "IC", respectively. The reference current levels for the same trimming code are different among "A", "B", and "C" computers, due to the fabrication variation and/or the power-supply voltage variation. Achieving successful data read despites these variation requires the flash memories 2 within the "A", "B", and "C" computers to be configured with appropriate trimming codes in the memory arrays 21 through the pre-shipping test. Specifically, as shown in FIG. 5, the flash memories 2 within the "A", "B", and "C"computers are required to be configured with trimming codes of "111", "011", and "000", respectively, for achieving successful data read. It should be noted that in FIG. 5, the region "S1" denotes the range of the allowable reference current level during the reset sequence of the computer system, and the region "S2" denotes the range of the allowable reference current level during normal operations, in which the CPU 1 operates at a frequency higher than that during the reset sequence.

Figure 1:
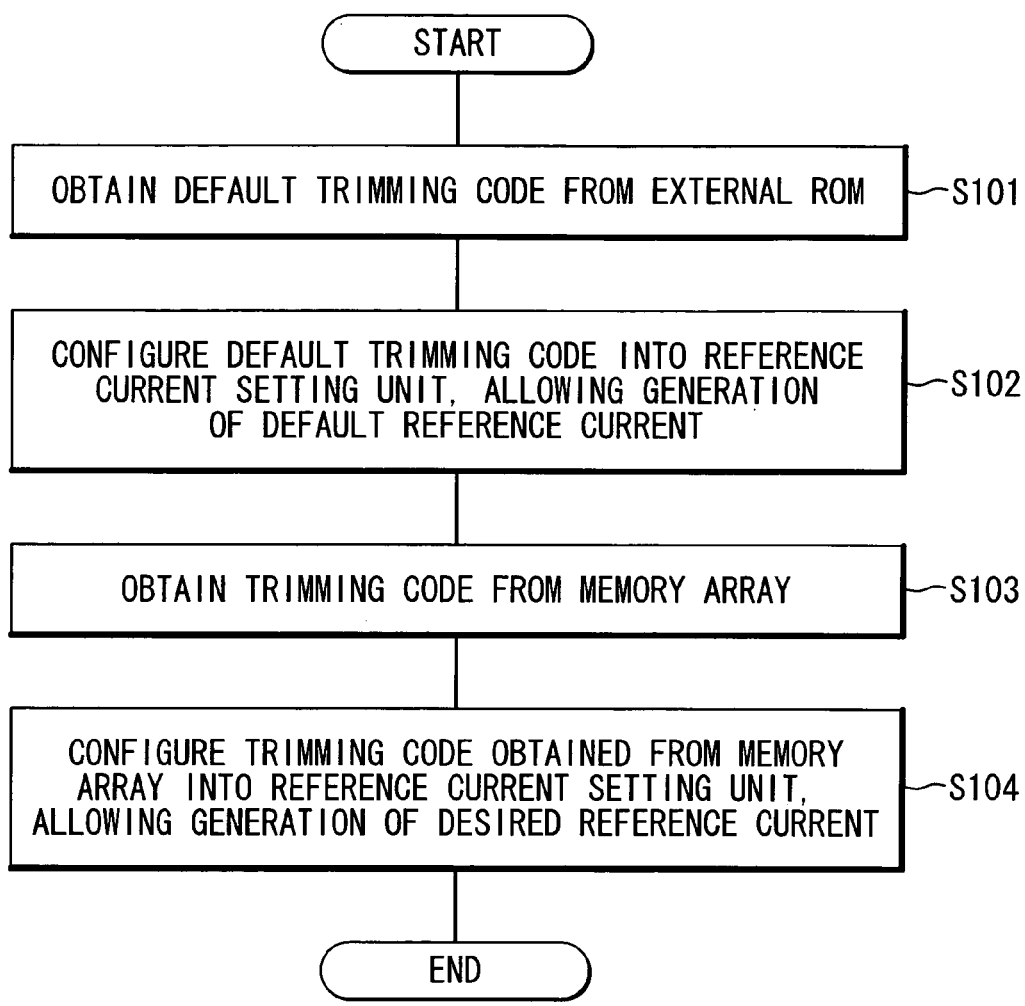
FIG. 1 is a flowchart that depicts an exemplary procedure of configuring a reference current level within a memory device.
Figure 2:
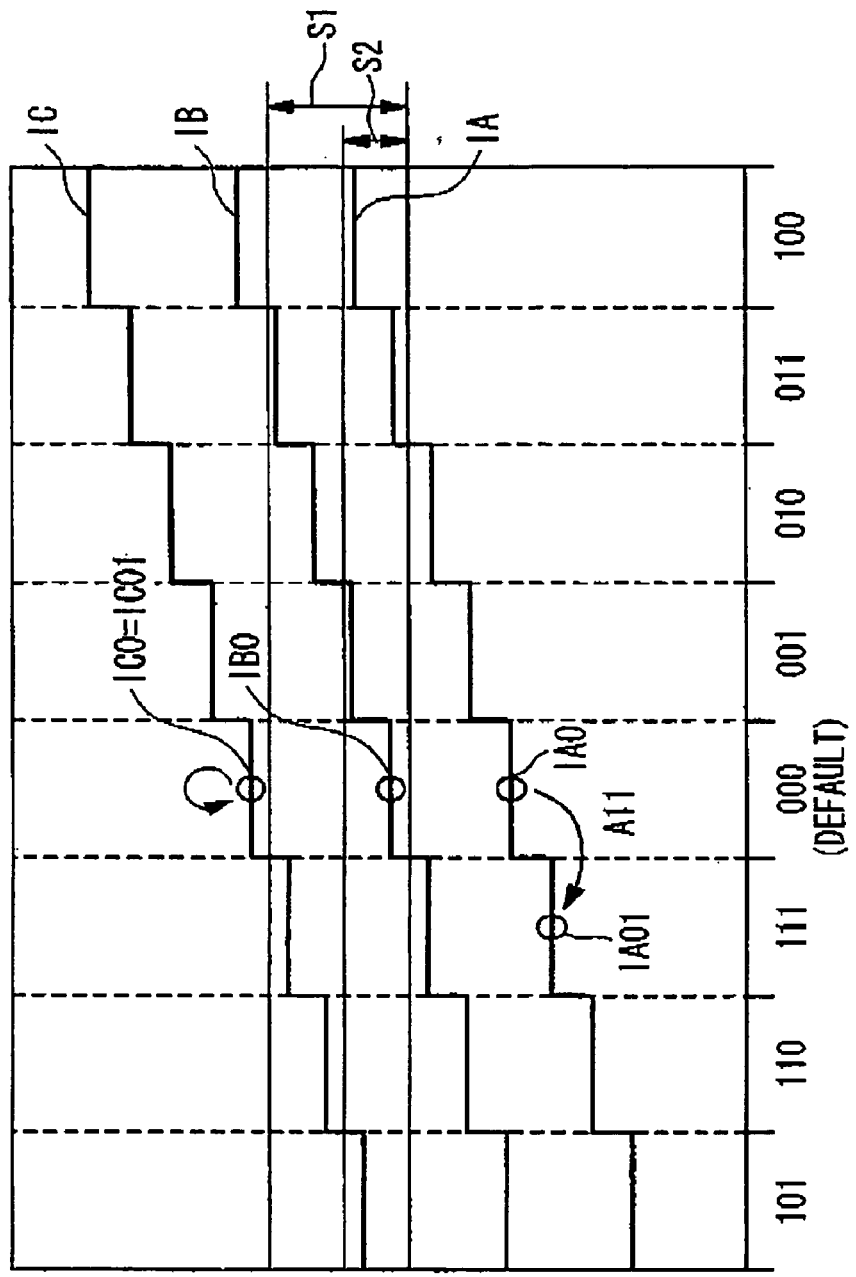
FIG. 2 depicts an association of a trimming code with a reference current level defined for a conventional memory device.

A reference current setting method executed during the reset sequence in this embodiment is basically equal to the conventional reference current setting method described with reference to FIG. 1. Referring back to FIG. 1, the CPU 1 reads and executes a boot program stored in the ROM 3, when the computer system is booted, or reset to initiate the reset sequence. During the reset sequence, the CPU 1 obtains the default trimming code TCx from the ROM 3 at Step S101. The CPU 1 then configures the default trimming code TCx into the register 231 of the reference current setting unit 23 at Step S102. This allows the reference current setting unit 23 to provide the sense amplifier circuit 22 with reference currents of the current level corresponding to the default trimming code TCx. The sense amplifier circuit 22 identifies the appropriate trimming code TCc stored in a specific memory area of the memory array 21 using the reference currents provided from the reference current setting unit 23 at Step S103. The CPU 1 configures the appropriate trimming code TCc obtained from the memory array 21 into the register 231 of the reference current setting unit 23 in place of the default trimming code obtained from the ROM 3. This allows the reference current setting unit 23 to provide the sense amplifier circuit 22 with the reference currents of the desired current level on the basis of the appropriate trimming code TCc at Step S104. Thereafter, the sense amplifier circuit 22 reads data from the memory cell array 21 on the basis of the reference currents of the newly configured current level.

As is understood from FIG. 5, the reference current levels configured into the reference current setting unit 23 in response to the default trimming code are different among the "A", "B", and "C", computers; the reference current levels defined for the "A", "B", and "C" computers are denoted by the symbols "IA0", "IB0", and "IC0", respectively, in FIG. 5.

In the "B" computer, the trimming code stored in the memory array 21 is successfully identified as "011", since the default reference current IB0 falls within the region S1. Configuring the reference current setting unit 23 with the appropriate trimming code obtained from the memory array 21 allows the reference current setting unit 23 to adjust the reference current level IB1 (=IB0) within the region S2. This allows the sense amplifier circuit 22 to achieve successful data read from the memory array 21 during normal operations of the computer B.

In the "A" and "C" computers, on the other hand, the trimming codes are not successfully obtained from the memory array 21 due to the reference current level characteristics of the respective flash memories 2, as is understood from FIG. 5; however, this does not cause data read errors during normal operations, as explained in the following.

For the "A" computer, in detail, the default reference current level IA0 corresponding to the default trimming code is lower than the allowable reference current levels, out of the region S1, and therefore the appropriate trimming code TCc is not successfully obtained from the memory array 21; the sense amplifier circuit 22 improperly identifies all of the data bits of the trimming code TCc stored in the memory array 21 as logic "1". This results in that the reference current setting unit 23 is configured with a wrong trimming code of "111". Nevertheless, this does not cause data read errors during normal operations in the "A" computer. As indicated by an arrow A1 in FIG. 5, the reference current setting unit 23, configured with the wrong trimming code of "111", generates the reference currents of the current level "IA1" in response to the wrong trimming code of "111", so that the current level "IA1" falls in the region "S2". Accordingly, the flash memory 2 in the "A" computer achieves successful data read during normal operations despites the fact that the trimming code is not successfully obtained from the memory array 21.

This is also the case for the flash memory 2 within the "C" computer. The default reference current level IC0 corresponding to the default trimming code is high than the allowable reference current levels, out of the region S1, and therefore the appropriate trimming code TCc is not successfully obtained from the memory array 21; the sense amplifier circuit 22 improperly identifies all of the data bits of the trimming code TCc stored in the memory array 21 as logic "0". This results in that the reference current setting unit 23 is configured with a wrong trimming code of "000". Nevertheless, this does not cause data read errors during normal operations in the "C" computer. As indicated by an arrow C1 in FIG. 5, the reference current setting unit 23, configured with the wrong trimming code of "000", generates the reference currents of the current level "IC1" in response to the wrong trimming code of "00", so that the current level "IC1" falls in the region "S2". Accordingly, the flash memory 2 achieves successful data read during normal operations in the "C" computer, despites the fact that the trimming code is not successfully obtained from the memory array 21.

In summary, in the flash memory 2 of this embodiment, the trimming code associated with to the minimum reference current level is defined as being "000", while the trimming code associated with to the maximum reference current level is defined as being "111"; the default trimming code is defined as being the mean value of the trimming code, that is, "011". This allows the flash memory 2 to achieve successful data read, despites the fact that a wrong trimming code may be obtained from the memory array 21.

It is apparent that the present invention is not limited to the above-described embodiments, which may be modified and changed without departing from the scope of the invention.

Especially, it should be noted that the number of the data bits of the trimming code is not limited to three; the number of the data bits of the trimming code may be four or more. In this case, the trimming code may be defined so that the trimming code corresponding to the lowest reference current level is defined as being an all-0 code, and the trimming code corresponding to the highest reference current level is defined as being an all-1 code.

Additionally, the trimming code may be defined as being complementary to that described in this embodiment, for the case that the flash memory 2 identifies the data stored in the memory array 21 as logic "0" when the signal current level is higher than the reference current level, and vice versa. In this case, the trimming code corresponding to the lowest reference current level is defined as being all-1, and the trimming code corresponding to the highest reference current level is defined as all-0.

Although the default trimming code is stored in the ROM 3 in this embodiment, a register may be alternatively incorporated in the flash memory 2, which is automatically configured with the default trimming code upon the initiation of the reset sequence of the computer. For example, the flash memory 2 may be designed so that the register 231 within the reference current setting unit 23 is automatically configured with the default trimming code during the reset sequence of the computer. This allows the flash memory 2 to rapidly obtain the trimming code from the memory array 21, and thereby promotes the high-speed processing within the computer.

It should be also noted that the present invention is also applicable to other memory devices which identify data stored in the memory array on the basis of the reference current with the reference current level indicated by the trimming code stored in the floating gate memory array. For example, the present invention is also applicable to a memory device incorporating both a DRAM memory array and a flash memory, which stores the trimming code used for the DRAM memory array in the flash memory array.

What is claimed is:

1. A memory device comprising:
    a memory array including floating gate memory cells;
    a sense amplifier designed to identify data stored in said memory array;
    a reference current setting unit responsive to a trimming code for providing a reference current for said sense amplifier,
    wherein said trimming code is defined as being all-0 for a reference current level to identify data stored in said memory array as logic "1", and is defined as being all-1 for a reference current level to identify data stored in said memory array as logic "0".

2. The memory device according to claim 1, wherein said sense amplifier is designed to identify data stored in said memory array as logic "1" when a signal current from said memory array is larger than said reference current, and as logic "0" when said signal current is smaller than said reference current,
    wherein said trimming code is defined as being all-0 for the minimum reference current level, and defined as being all-1 for the maximum reference current level.

3. The memory device according to claim 1, wherein said reference current setting unit is configured with a default trimming code as said trimming code when said memory device is initialized, said default trimming code being closest to the mean value of said trimming code.

4. The memory device according to claim 1, wherein said memory array stores therein an appropriate trimming code,
    wherein said reference current setting unit is designed to configured with a default trimming code as said trimming code when said memory device is initialized,
    wherein said sense amplifier is designed to obtain said appropriate trimming code from said memory array using a reference current developed in response to said default trimming code,
    wherein said reference current setting unit is designed to be configured with said appropriate trimming code in place of said default trimming code.

5. The memory device according to claim 4, wherein said reference current setting unit receives said default trimming code from an ROM during a reset sequence of a computer system.

6. The memory device according to claim 4, wherein said reference current setting unit includes a register designed to be automatically configured with said default trimming code upon initiation of a reset sequence of a computer system.

7. A method for configuring a memory device including a floating gate memory array with a trimming code indicative of a desired reference current level, said method comprising:
    configuring a reference current setting unit within said memory device with a default trimming code;
    developing a first reference current in response to said default trimming code;
    identifying an appropriate trimming code stored in a floating gate memory array using said first reference current; and
    configuring said reference current setting unit with said identified appropriate trimming code in place of said default trimming code,
wherein said default trimming code and said appropriate trimming code are defined as being all-0 for the minimum reference current level, and defined as being all-1 for the maximum reference current level.

* * * * *